United States Patent [19]
Autran

[11] 4,217,564
[45] Aug. 12, 1980

[54] ELASTIC SURFACE WAVE DEVICE FOR TREATING HIGH FREQUENCY SIGNALS

[75] Inventor: Jean-Michel Autran, Paris, France

[73] Assignee: Thomson-CSF, Paris, France

[21] Appl. No.: 942,622

[22] Filed: Sep. 15, 1978

[30] Foreign Application Priority Data

Sep. 20, 1977 [FR] France ............................ 77 28303

[51] Int. Cl.² .................. H03H 9/30; H03H 9/32; H03H 9/26; H01L 41/10
[52] U.S. Cl. .................................... 333/152; 333/153; 333/196
[58] Field of Search ............................ 333/193–195, 333/196, 150–155; 310/313; 331/107 A; 364/821; 330/5.5; 357/25, 26

[56] References Cited

U.S. PATENT DOCUMENTS

| | | | |
|---|---|---|---|
| 3,831,115 | 8/1974 | Coldren | 333/150 |
| 3,845,420 | 10/1974 | Holland et al. | 333/153 |
| 3,963,997 | 6/1976 | Hartemann | 333/150 |

Primary Examiner—Marvin Nussbaum
Attorney, Agent, or Firm—Roland Plottel

[57] ABSTRACT

The treatment is directly effected on the waves propagated. Zones, for creating interruptions in propagation, are created on the useful surface of the propagation material. Several parallel tracks for propagating the elastic waves are thus delimited by these zones, the length and width of which are selected in dependance upon the required treatment.

12 Claims, 10 Drawing Figures

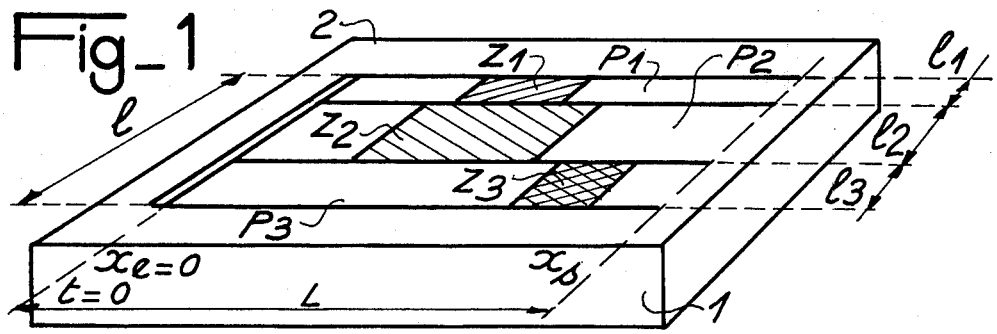
Fig_1
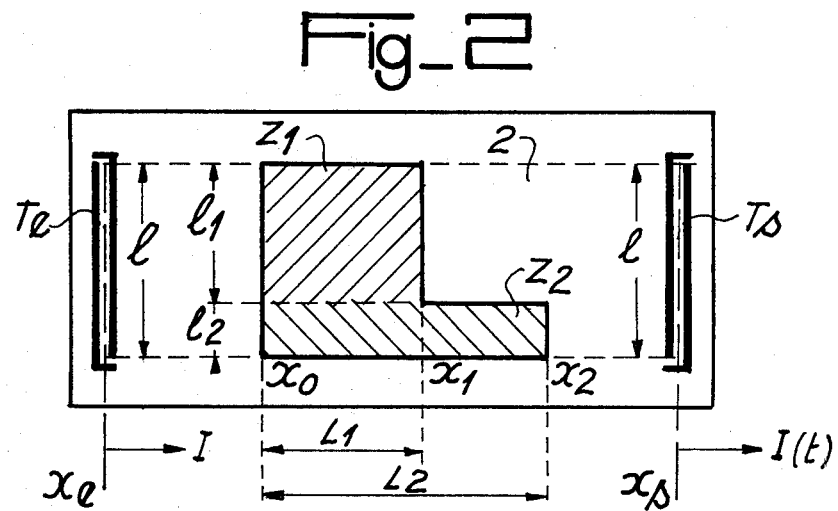
Fig_2
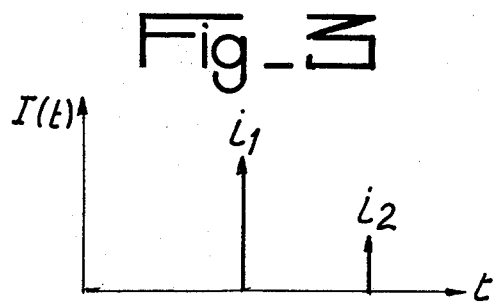
Fig_3
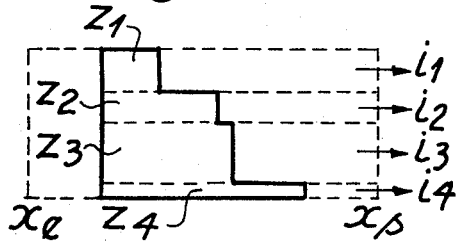
Fig_4
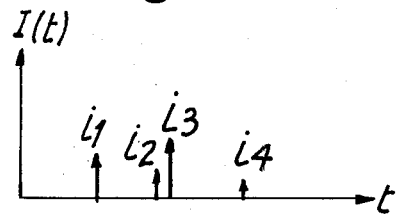
Fig_5

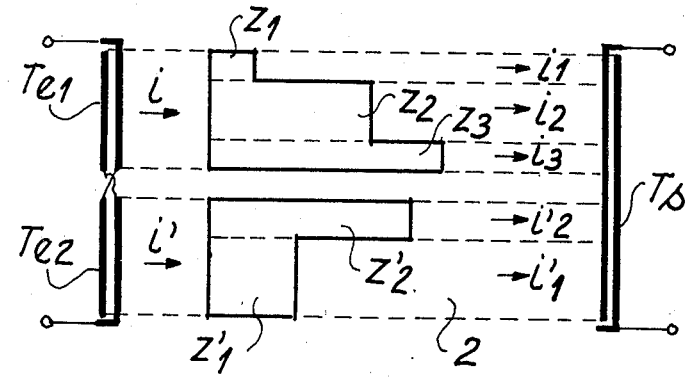
Fig_6
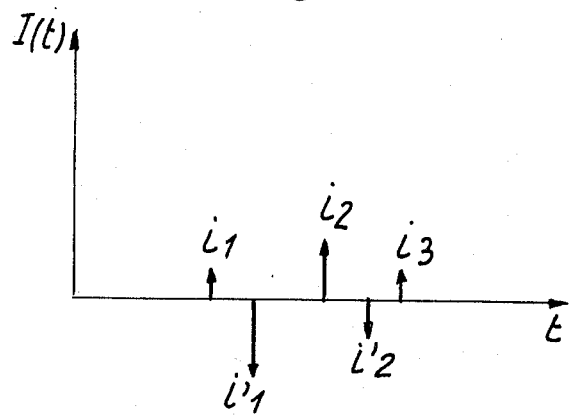
Fig_7
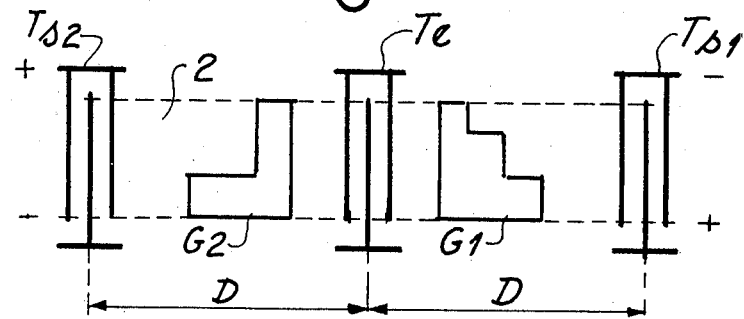
Fig_8

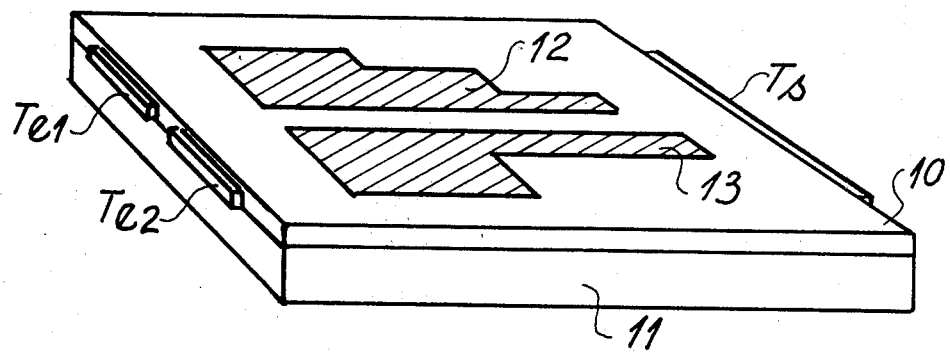
Fig_9
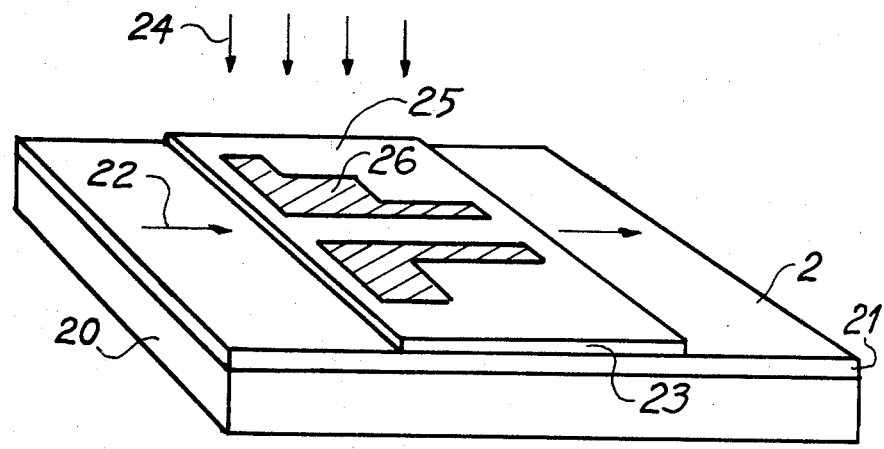
Fig_10

ELASTIC SURFACE WAVE DEVICE FOR TREATING HIGH FREQUENCY SIGNALS

This invention relates to elastic surface wave devices capable of treating electrical signals at high frequencies by the set of elastic waves into which they are converted and which are propagated at the surface of materials varying according to the type of elastic waves and transducers used.

It is now established practice to construct devices for treating signals at high frequencies, such as for example filters or dispersive delay lines, using the technique of elastic surface waves: acoustic waves being propagated at the surface of optionally piezoelectric materials, Love waves being propagated in a thin layer deposited on a substrate.

One known method of synthesising a filter having a transfer function T (F), F being the frequency of the signal to be filtered, consists in effecting the treatment which will lead to the required filtering during conversion of the electrical signal to be treated into an elastic wave which is propagated at the surface of the device and/or during the opposite conversion of the eleastic wave propagated into an electrical output signal. This treatment during conversion is effected by means of the input and/or output transducer which is calculated and dimensioned to that end.

One filter of this type comprise for example transducers in the form of combs arranged on a piezoelectric surface. The treatment carried out on the converted signal by transducers of this type is dependent upon the number, the dimensions and the spacing of the fingers of the combs. The treatment may be effected by one of the two input and output transducers in which case the other transducer is a wide-band transducer of which the sole function is to ensure conversion of the signal. The transfer function T (F) of the filter is comparable with that of the sole transducer effecting a treatment. It may also be carried out by combining the filtering effects of the two transducers. In this case, the transfer function of the filter is the product of the transfer functions of the two transducers.

In order to obtain a given transfer function T(F) with one transducer, this transducer has to have a pulse response I (t) of which the Fourier transform is the desired transfer function T (F).

To this end, the inverse Fourier transform of T (F) is calculated, i.e. I (t). The positions and the values of the maxima of this function I (t) are determined and, by effecting the time-space transformation ($x=vt$, v being the velocity of the acoustic waves), an interdigital digital transducer is obtained which materialises the discrete sources situated at the maxima of I (x) with the suitable amplitudes. This last operation uses the discrete source method or "deltas" method which assimilates each pair of fingers of a transducer with an infinitely narrow ultrasonic generator located on the median line between the two fingers. The amplitude of each discrete source is proportional to the overlap length of the two corresponding fingers, its sign being + or − according to the direction of the electrical field between the two fingers.

These synthesis methods are well known to the expert and are described, for example, in a work by E. Dieulesaint and D. Royer entitled "Ondes élastiques dans les solides. Application au traitement du signal (Elastic Waves in Solids. Application to the Treatment of Signals)", published by Editions Masson et Cie.

It should be pointed out that these filters are attended by a serious disadvantage when it comes to treating signals of very high frequency, for example beyond 700 MHz. This is because, the higher the frequencies to be treated, the closer together the fingers of the transducers have to be, the mean distance d between two adjacent fingers, or the sampling interval being $d=\lambda o/2=1/2\, Fo$ for a mean operating frequency Fo of the filter. It is clear that problems of technology impose limits on the construction of filters of the type in question for very high frequencies.

It is also known that filters can be constructed by a different method which consists in using wide-band input and output transducers which do not carry out any treatment on the signal which they convert and in effecting the treatment which will lead to the filtering on the acoustic wave propagated. Although one known method of this type does facilitate the production of transducers which no longer have to have fingers situated very closely to one another for high frequencies, it is nevertheless attended by an entirely equivalent disadvantage at the level of the means which enable the surface waves to be treated along their propagation path. This is because the dispersive treatment is ensured by the well known technique of networks disposed on the path of these waves: for example etched grooves, metallic networks, implanted networks. The spacing of these networks, i.e. the distance between two of their adjacent discrete interruptions, is narrower, the higher the frequency of the waves to be treated. Unlike the filters produced by the discrete source method mentioned above, network filters do not enable frequencies beyond 700 MHz to be suitably treated because, at frequencies of this order, the periodicity of the networks (like that of the fingers of the transducers) falls below the limits of resolution obtained by conventional masking techniques.

One object of the present invention is to enable surface wave filters capable of working well beyond 700 MHz to be obtained. The frequency resolution limit of the filters proposed by the invention is multiplied by a coefficient which may be of the order of 50 or even 100 and higher, depending on the types of material used.

To this end, the present invention consists on the one hand in directly carrying out the filtering treatment on the surface waves propagated, so that it is possible to use wide-band input and output transducers which do not involve any problems of technology, and on the other hand in carrying out this filtering treatment by means which, unlike the networks, do not have a periodic spatial structure.

Accordingly, no high frequency limits are imposed by the geometry of the filter. However, limitations arising out of other factors do exist, as will be seen hereinafter. As already mentioned, they are far less serious than those associated with the geometry of conventional periodic structures.

An elastic surface wave device according to the invention for treating high-frequency waves comprises:

a material for propagating said surface waves at a predetermined velocity v, on an useful propagation surface;

Input means delivering a front of acoustic waves to be treated to one end, the so-called input end, of the said useful propagation surface of said material;

means, combined with said useful surface, for creating interruptions in propagation in zones, where the propagation velocity is different from that of said material, said zones delimiting several parallel tracks for propagating the elastic waves issuing from said wave front, and the length and width of said zones being selected in dependence upon the required treatment.

Other aspects, features and results of the invention will become apparent from the following description given by way of non-limiting example in conjunction with the accompanying drawings, wherein:

FIG. 1 is a highly diagrammatic perspective view of a device according to the invention enabling the essential characteristics of the invention to be understood both from the point of view of its structure and from the point of view of its operation.

FIG. 2 shows one example of the configuration of the interruption zones enabling a predetermined pulse response, as diagrammatically illustrated in FIG. 3, to be obtained.

FIG. 4 shows another example of configuration and FIG. 5 the shape of its pulse response.

FIG. 6 shows one example of the configuration of a device according to the invention for forming band filters or dispersives lines, FIG. 7 showing the shape of its pulse response.

FIG. 8 shows another example of the device according to the invention which is capable of being used for forming band filters or dispersive lines.

FIG. 9 is a diagrammatic perspective view of a Love wave filter of which the combination with the means according to the invention enables the dispersion to be accentuated.

FIG. 10 is a diagrammatic perspective view of a variant of the device according to the invention where the means producing the interruption zones are formed by the projection of an image.

FIG. 1 shows highly diagrammatically how acoustic surface waves are treated by means of the invention without using periodic geometric structures.

It should be noted that all the accompanying Figures are diagrammatic and are in no way drawn to scale.

On a material 1 of which the surface 2 is capable of propagating elastic surface waves, input means, of which various examples will be described hereinafter, emit at an instant t=O a front of untreated acoustic waves which, in the absence of the means characteristic of the invention, would be propagated at a constant velocity v in dependence upon the propagation material. This front of input waves emitted on the abscissa $x_e$ would give rise, again in the absence of the means according to the invention, to a parallel wave front collected for example at $x_s$ by output means (not shown), the velocity v being the same for all the parallel propagation paths and along the entire length thereof.

The invention consists essentially in dividing the useful propagation surface of width l and length L into several parallel propagation tracks $P_1$, $P_2$, $P_3$ having a length L and respective widths $l_1$, $l_2$, $l_3$ and in obtaining different propagation times $T_1$, $T_2$, $T_3$ in said tracks by means which create propagation velocities $v_1$, $v_2$, $v_3$ different from v in zones $Z_1$, $Z_2$, $Z_3$. The waves simultaneously emitted at the input $x_e$ thus arrive phase-shifted to a greater or lesser extent at the output $x_s$ along the track where they are propagated and the signal collected at the output is treated like a signal which would be uniformly propagated, but which would have been emitted by different sources (discrete source methods).

Different methods known per se for varying the propagation velocities will be described with the different variants of the invention. They may consist for example in effecting metallic deposits or ion implantations in the zones $Z_1$, $Z_2$, $Z_3$.

The method used for synthesising filters having a predetermined transfer function T (F) may be readily be transposed from that used for discrete source filters.

This is because, if an electrical pulse I is applied at an instant t=o to the input $x_e$ of the device shown in FIG. 1, it will give rise to three phase-shifted pulses at the output $x_s$.

The amplitude of each of these three pulses is proportional to the width of each track and, their relative phase shifts are proportional to the relative lengths of the interruption zones where the pulses are propagated.

Accordingly, it is clearly apparent that predetermined pulse responses I (t) may be obtained with devices of the type in question.

The example shown in FIG. 1 represents the most complex case where the various tracks are defined by interruption zones where the propagation velocities $v_1$, $v_2$, $v_3$ are not only different from that, v, of the substrate, but are also different from one another.

Generally, it is sufficient to use only two propagation velocities, that of the substrate v and that v' of the interruption zones.

FIG. 2 diagrammatically illustrates one example of configuration of the interruption zones in a device according to the invention having two different propagation velocities: v on the substrate 2 and v' on the interruption zones $Z_1$ and $Z_2$ with, for example, v<v'.

It can be seen that, in this configuration, the dispersive treatment will be effected by that part of the zone $Z_2$ which is comprised between the abscissae $x_1$ and $x_2$. This is because the acoustic pulse I which arrives at $x_o$, although completely decelerated, is not deformed. It is only deformed from the abscissa $x_1$ where that part of the pulse which is propagated on the track delimited by $Z_1$ re-assumes the velocity v, whilst that part which is propagated along the track delimited by $Z_2$ retains the velocity v' up to $x_2$.

The phase shift $\Delta t$, between the arrival at $x_s$ of these two parts $i_1$ and $i_2$ of the pulse consists in a delay of the pulse $i_2$ corresponding to the zone $Z_2$, the value of this delay being as follows:

$$\Delta t = (x_2 - x_1)(\frac{1}{v'} - \frac{1}{v})$$

So far as the amplitude of these two pulses $i_1$ and $i_2$ is concerned, it is respectively proportional to the widths $l_1$ and $l_2$ of the zones $Z_1$ and $Z_2$.

Accordingly, the pulse response I(t) has the shape illustrated in the graph of FIG. 3.

A more complex configuration of the interruption zones, such as that shown in FIG. 4, gives a more complex, but perfectly calculable pulse response where all the pulses have the same sign, as shown in FIG. 5.

The input and output means, which have not yet been described, may consist of any known type of transducer depending in particular on the substrate. They may consist for example of wide-band comb transducers where all the fingers have the same dimensions and the same spacing because they do not have to effect any treatment. It should also be noted that, if the signal to be treated or collected is not an electrical signal, but instead is actually an acoustic surface wave, there is no need for a transducer. This is another advantage of the devices according to the invention where the treatment is directly carried out on the acoustic wave.

The devices described thus far have pulse responses in which all the pulses are positive. Now, it is well known, for example from the work cited above, that for forming band filters or dispersive lines it is necessary to synthesise a pulse response I (t) which shows an alternation of positive and negative sources, i.e. a pulse response which, as already mentioned is the inverse Fourier transform of the transfer function T (F) required for the filter.

The treatment devices according to the invention may readily be used for obtaining pulse responses of this type showing an alternation of positive and negative pulses, because it is sufficient to divide one or other of the input or output means in two so as to deliver two pulses of opposite sign towards two groups of tracks, i.e. to reverse the pulses received from one of these two groups.

FIG. 6 illustrates highly diagrammatically a device according to the invention enabling pulse responses of the type in question to be obtained. FIG. 7 illustrates the pulse response of this device.

FIG. 6 shows wide-band input and output comb transducers deposited on the substrate 2 which consists for example of a piezoelectric material. Whereas the output comprises a single transducer Ts which adds the phaseshifted pulses which it receives from two groups of tracks, the input comprises two symmetrical transducers Te1 and Te2 connected to emit two symmetrical pulses i and i'. After being propagated along the three tracks delimited by $Z_1$, $Z_2$, $Z_3$, the pulse i will give the positive pulses $i_1$, $i_2$, $i_3$, as described in the preceding examples. After being propagated along the two tracks delimited by $Z'_1$ and $Z'_2$, the pulse i' will give the negative pulses $i'_1$ and $i'_2$.

Other measures are possible for achieving the alternation in the signs of the pulses. It has already been mentioned that it would be possible to use one input transducer and two symmetrical output transducers.

FIG. 8 shows another type of configuration which uses the property of the input transducer Te of emitting identical wave fronts in the two directions of propagation. Two identical output transducers $Ts_1$ and $Ts_2$ equidistant from Te respectively collect the pulses which are propagated in the two directions and which are treated by the two groups of interruption zones G1 and G2. They are used in phase opposition, as indicated in the Figure, to ensure that the two groups of pulses are opposite in sign. The electrical signals which they deliver are then added by means (not shown) to obtain the required pulse response.

It should be noted that, in the illustrations of FIGS. 2 to 8, the interruption zones defining the various tracks have been shown throughout as being attacked at the same time by the various points of the wave front. This configuration is by no means the only possible configuration. These zones may be situated in any abscissa of the tracks along the propagation direction, as symbolically illustrated in FIG. 1. This is because what is important is not their position, but rather their length. They may also each be formed in several parts along the propagation direction.

It is also possible to separate these various zones by a narrow interval perpendicular to the propagation direction. A configuration such as this makes it possible to avoid or at least to reduce the diffraction phenomena.

Thus, the devices according to the invention enable high frequency band filters operating in particular at frequencies beyond 500 MHz to be obtained by a simple masking technique, the interruption zones being formed for example by implantation or metallisation.

In the case of conventional filters based on interdigital transducers or networks, the frequency resolution limit is determined by the spatial resolution limit $\Delta$ x of the fingers of the transducers or of the spacing of the networks with:

$$\Delta x = \lambda/2 = 1/2F$$

In the devices according to the invention, this limit is no longer dependent upon a spatial resolution $\Delta$ x, because there is no periodic arrangement, but instead upon the relative variation in velocity $\Delta$ v/v which is rendered possible by the interruption zones $Z_1$, $Z_2$ . . .

If this limit $\Delta$ v/v is reduced to the limit $\Delta$ x defined above, then $$\Delta x = \frac{\lambda}{2} \cdot \frac{v}{\Delta v}.$$

Accordingly, the frequency resolution limit is multiplied by v/$\Delta$v in relation to that of conventional filters.

In the case of a substrate of lithium niobate with a metallic deposit $\Delta$ v/v=0.02, the frequency resolution limit is multiplied by 50. In the case of quartz, $\Delta$ v/v=0.01, it is multiplied by 100.

These devices may be formed on any materials providing they are capable of propagating acoustic surface waves and providing variations in velocity may be locally introduced. For example, a filter may be formed on glass with welded transducers and velocity interruption zones formed by ion implantation.

The parameters of these zones (the type and thickness of metal deposited, the density of implanted ions . . . ) determine the value of the relative variation in velocity and, hence, the central frequency of the filter.

It should also be noted that the device according to the invention may be used in combination with conventional filters to complete their filtering function. Thus if, for example, the wide-band transducers Te and Ts of FIG. 2 are replaced by transducers having transfer functions $T_1$ (F) and $T_2$(F), the total transfer function of the device will be:

$$\mathcal{E}(F) = T_1 . T_2 . T$$

T being the transfer function resulting from the zones $Z_1$ and $Z_2$.

It is also possible to combine a device according to the invention with a Love wave dispersive line, as diagrammatically illustrated in FIG. 9.

A Love-wave line, such as described for example in the work cited above, comprises a thin layer 10 on a substrate 11 (for example silica on silicon), an input transducer and an output transducer. The acoustic waves generated by the input transducer are reflected at the interface and travel through the thin layer at a velocity dependent on their frequency. This dispersive effect may be accentuated or weakened by combining a line of this type with a device according to the invention, as illustrated in FIG. 9. Two input transducers $Te_1$ and $Te_2$, of which the transfer functions are the same as those of the transducers $Te_1$ and $Te_2$ of FIG. 6, deliver Love waves towards an output transducer Ts equivalent to that shown in FIG. 6. Propagation interruption zones equivalent to those shown in FIG. 6 modify the velocity of the waves propagated along the corresponding tracks.

In all the examples of embodiment described thus far, the transfer function of a filter is determined once and for all by the geometric configuration given during production to its propagation velocity interruption zones.

Another embodiment which is particularly interesting and which has the same operating characteristics as the embodiments already described makes it possible to obtain a filter of which the transfer function is not determined by its production, but instead may be selected and modified at any moment during its use.

This embodiment consists in covering the useful surface 2, where the surface waves are propagated, with a continuous photoconductive layer rather than with discrete metallic zones corresponding to the interruption zones. Different degrees of illumination of different zones of this layer will create the interruption zones.

FIG. 10 is a highly diagrammatic view of one example of embodiment of a device such as this. In this case, the propagation material is formed by a non-piezoelectric substrate 20 covered by a layer 21 of piezoelectric zinc oxide. The acoustic waves 22 are propagated at the surface 2 of the layer 21. It should be noted that this type of propagation material (a substrate covered by a piezoelectric layer) may be used in the variants of the invention described above.

The useful surface 2 for propagating the waves 22 is covered by a layer 23 of a photoconductive material, such as a semiconductor, for example cadmium sulphide. When this layer 23 is illuminated by a light beam 24 through a mask 25 of which the openings 26 determine the surfaces of the interruption zones according to the invention, it is only these zones which are illuminated and correspond to conductive parts of the semiconductor 21. The acoustic waves which are propagated at the surface 2 of the layer 21 have a propagation velocity modified by these conductive parts of the layer 23.

It is sufficient to change the mask in order to change the configuration of the interruption zones, and hence, the transfer function of the treatment device.

It is also possible to vary the transfer function by changing the intensity of the light beam 24 rather than the configuration of the mask. In this case, the relative variation in velocity $\Delta v/v$ is modified as, hence, is the transfer function of the filter.

We claim:

1. An elastic surface wave device for treating high frequency waves forming a filter having a transfer function T(F) of which the inverse Fourier transform I (t), which is the pulse response of the filter, comprises n pulses identical in sign, phase-shifted relative to one another and of various amplitudes which comprises:
    A material for propagating said surface waves at a predetermined velocity v, on a useful propagation surface;
    input means delivering a front of acoustic waves to be treated to one end, the so-called input end, of the said useful propagation surface of said material;
    means, combined with said useful surface, for creating interruptions in propagation in zones where the propagation velocity v' is different from that v of said material, said zones delimiting n parallel tracks for the propagation of the elastic waves issuing from said wave front, the width of said zones being proportional to the amplitude of said n pulses and their relative lengths being proportional to the relative phase shifts of said pulses.

2. A device as claimed in claim 1, wherein the said means for creating interruption zones on the surface of said propagation material consist in a treatment of said zones effected on the surface of said material during production of the device.

3. A device as claimed in claim 2, wherein said treatment consists in applying a metallic deposit to said zones, the parameters of this deposit, particularly the type and thickness of metal deposited, determining the relative variations in velocity of the acoustic waves.

4. A device as claimed in claim 2, wherein said treatment consists in implanting ions in said zones, the parameters of this implantation, particularly the type and density of the implanted ions, determining the relative variations in velocity of the acoustic waves.

5. A device as claimed in claim 1, wherein said means for creating interruption zones on the surface of said propagation material comprise a layer of a photoconductive semiconductor material deposited on said surface, the interruption zones appearing through a mask, of which the opening correspond to said zones, when said conductor is illuminated by a light beam.

6. A device as claimed in claim 1, wherein the high frequency waves to be treated consisting of an electrical signal, said input means comprise at least one input transducer.

7. A device as claimed in claim 6, wherein the acoustic waves treated during their propagation along said tracks are collected and converted into an electrical signal by at least one output transducer.

8. A device as claimed in claim 7 forming a filter having a transfer function T (F) of which the inverse Fourier transform I (t), which is the pulse response of the filter, comprises n pulses of given sign and m pulses of opposite sign phase-shifted relative to one another, which comprises:
    a first group of n parallel tracks and a second group of m parallel tracks, each of said n+m tracks comprising an interruption zone where the propagation velocity v' is different from that v of the rest of the useful propagation surface, the width of said zones being proportional to the amplitude of said n+m pulses and their relative lengths being proportional to the relative phase shifts of said pulses;
    two wide-band transducers as input and output transducers, the input transducer (or the output transducer) comprising two identical transducers connected in phase opposition.

9. A device as claimed in claim 8, wherein said two groups of n and m parallel tracks are offset perpendicularly to the propagation direction, the two transducers connected in phase opposition being aligned along the direction perpendicular to the propagation direction so that each of them corresponds to one of the two said offset groups.

10. A device as claimed in claim 8, wherein the input transducer emits a front of acoustic waves in the two propagation directions, the two said groups of n and m paralle tracks being situated on either side of this transducer, and the two output transducers being arranged symmetrically in relation to said input transducer so as to receive the waves respectively treated by the two said groups.

11. A device as claimed in claim 7, wherein one and/or the other of the input and output transducers has a predetermined transfer function.

12. A device as claimed in claim 8, wherein material propagating the surface waves being itself dispersive, the interruption zones modify said frequency dispersion of the treated waves.

* * * * *